US007653360B2

(12) United States Patent
Uejima et al.

(10) Patent No.: US 7,653,360 B2
(45) Date of Patent: Jan. 26, 2010

(54) HIGH-FREQUENCY COMPOSITE COMPONENT

(75) Inventors: Takanori Uejima, Omihachiman (JP); Naoki Nakayama, Sakai-gun (JP); Tetsuro Harada, Otsu (JP); Kunihiro Koyama, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/100,474

(22) Filed: Apr. 10, 2008

(65) Prior Publication Data
US 2008/0315968 A1 Dec. 25, 2008

Related U.S. Application Data

(63) Continuation of application No. 10/595,260, filed as application No. PCT/JP2005/013661 on Jul. 26, 2005, now Pat. No. 7,398,059.

(30) Foreign Application Priority Data

Aug. 6, 2004 (JP) .............................. 2004-231739

(51) Int. Cl.
*H04B 1/44* (2006.01)
(52) U.S. Cl. .................... 455/78; 455/83; 361/306.3; 310/313
(58) Field of Classification Search .............. 455/78, 455/83; 361/306.3; 310/313
See application file for complete search history.

(56) References Cited

U.S. PATENT DOCUMENTS

| | | | | |
|---|---|---|---|---|
| 5,994,980 | A * | 11/1999 | Tada ........................... 333/193 |
| 6,683,512 | B2 * | 1/2004 | Nakamata et al. ........... 333/126 |
| 6,750,737 | B2 * | 6/2004 | Uriu et al. ................... 333/133 |
| 6,856,187 | B2 * | 2/2005 | Kushitani et al. ........... 327/374 |
| 6,867,662 | B2 * | 3/2005 | Uriu et al. ................... 333/132 |
| 6,873,529 | B2 * | 3/2005 | Ikuta et al. .................. 361/719 |
| 6,900,705 | B2 * | 5/2005 | Nakamura et al. ........... 333/25 |
| 6,961,245 | B2 * | 11/2005 | Ikuta et al. .................. 361/719 |
| 7,010,273 | B2 * | 3/2006 | Satoh et al. .................. 455/83 |
| 7,027,777 | B2 * | 4/2006 | Uriu et al. ..................... 455/78 |
| 7,027,779 | B2 * | 4/2006 | Tai et al. ....................... 455/83 |

(Continued)

FOREIGN PATENT DOCUMENTS

EP  1 261 143 A  11/2002

(Continued)

OTHER PUBLICATIONS

Uejima et al.; "High-Frequency Composite Component"; U.S. Appl. No. 10/595,260, filed Mar. 31, 2006.

(Continued)

*Primary Examiner*—Matthew D. Anderson
*Assistant Examiner*—April G Gonzales
(74) *Attorney, Agent, or Firm*—Keating & Bennett, LLP

(57) ABSTRACT

A high-frequency composite component for selectively switching a GSM-system signal path and a DCS-system signal path for a signal transmitted to or received from an antenna terminal by a diplexer. Transmission-side input terminals and reception-side balanced output terminals to be switched by high-frequency switches are included in the GSM and the DCS systems. Matching elements include inductors and capacitors that are inserted between the reception-side balanced output terminals and the output side of surface acoustic wave filters.

15 Claims, 16 Drawing Sheets

U.S. PATENT DOCUMENTS

| | | | |
|---|---|---|---|
| 7,149,496 B2* | 12/2006 | Horiuchi et al. | 455/333 |
| 7,466,211 B2* | 12/2008 | Uejima et al. | 333/101 |
| 2003/0085774 A1* | 5/2003 | Uriu et al. | 333/133 |
| 2003/0201846 A1* | 10/2003 | Nakamura et al. | 333/193 |
| 2004/0032706 A1* | 2/2004 | Kemmochi et al. | 361/306.3 |
| 2004/0048634 A1 | 3/2004 | Satoh et al. | |
| 2006/0186755 A1* | 8/2006 | Mori et al. | 310/313 R |
| 2007/0035362 A1* | 2/2007 | Uejima et al. | 333/133 |
| 2008/0315968 A1* | 12/2008 | Uejima et al. | 333/4 |

FOREIGN PATENT DOCUMENTS

| | | |
|---|---|---|
| JP | 2001-211097 A | 8/2001 |
| JP | 2003-152590 A | 5/2003 |

OTHER PUBLICATIONS

Official communication issued in counterpart Chinese Application No. 200580001315.7, mailed on Dec. 19, 2008.

Official communication issued in counterpart European Application No. 05767376.6, mailed on Feb. 27, 2009.

Lucero et al.: "Design of an LTCC Integrated Tri-Band Direct Conversion Receiver Front-End Module," XP-001113899; 2002 IEEE MTT-S International Microwave Symposium; Jun. 2, 2002; pp. 1545-1548.

* cited by examiner

HIGH-FREQUENCY COMPOSITE COMPONENT

BACKGROUND OF THE INVENTION

1. Field of the Invention

The present invention relates to a high-frequency composite component, and more particularly, to a high-frequency composite component for use in a plurality of different mobile communication systems.

2. Description of the Related Art

Presently, in Europe, as a mobile communication device, a dual-band portable telephone has been proposed which can operate in a plurality of frequency bands, for example, in the DCS system using a 1.8 GHz band and the GSM system using a 900 MHz band.

FIG. 18 shows a portion of the structure of a general dual-band portable telephone which includes an antenna 1, a diplexer 2, and two signal paths of a DCS system 3 (1.8 GHz band) and a GSM system 4 (900 MHz band).

The diplexer 2 selects a transmission signal from the DCS system 3 or the GSM system 4 in transmission and selects a reception signal to the DCS system 3 or the GSM system 4 in reception. The DCS system 3 includes a high-frequency switch 3a for separating a transmission portion Txd and a reception portion Rxd and a filter 3b for allowing the fundamental frequency of the DCS system to pass through and for attenuating the second and third harmonics. In the same manner, the GSM system 4 also includes a high-frequency switch 4a for separating a transmission portion Txg and a reception portion Rxg and a filter 4b for allowing the fundamental frequency of the GSM system to pass through and for attenuating the third harmonics.

In recent years, a balanced-type (balanced-output type) high-frequency composite component having two signal terminals in the reception portion has been proposed and, in such a balanced type, the impedance matching to a low-noise amplifier (LNA) is required.

In Japanese Unexamined Patent Application Publication No. 2003-142981 (Patent Document 1), as shown in FIG. 19, an inductor 6 is disposed in parallel between the balanced output terminals Rx of a bandpass filter defined by a balanced-output type surface acoustic wave filter. However, it is difficult to set a desired impedance (complex impedance, in particular). According to the knowledge of the present inventor, in order to lower the impedance, a capacitor must be inserted in series to each of the balanced output terminals, and, to increase the impedance, one more inductor must be inserted in parallel between the balanced output terminals in addition to the above-described capacitors. However, when capacitors and inductors as separate components are added between such a high-frequency composite component and an LNA, the number of components and the mounting area increase which increases the size of the equipment, and the matching between the bandpass filter 5 and the LNA becomes more complicated.

SUMMARY OF THE INVENTION

To overcome the problems described above, preferred embodiments of the present invention provide a high-frequency composite component in which a desired impedance is easily set in the high-frequency composite component itself, no matching adjustment to an LNA is required, the number of components is reduced, and the overall size is reduced.

Furthermore, preferred embodiments of the present invention provide a high-frequency composite component in which interference between the elements is prevented, and in which excellent characteristics are achieved.

A high-frequency composite component according to a preferred embodiment of the present invention includes a switch for selectively switching a signal path between an antenna terminal and a transmission-side input terminal and a signal path between the antenna terminal and a reception-side balanced output terminal, an LC filter having an inductor and capacitors disposed between the antenna terminal and the transmission-side input terminal, a surface acoustic wave filter disposed between the switch and the reception-side balanced output terminal, and a matching element having an inductor and capacitors disposed between the surface acoustic wave filter and the reception-side balanced output terminal. In the high-frequency composite component, the switch, the LC filter, the surface acoustic wave filter, and the matching element are integrated in an integrated block having a plurality of laminated dielectric layers.

In the high-frequency composite component according to this preferred embodiment of the present invention, since a matching element having an inductor and capacitors is disposed between a surface acoustic wave filter and a reception-side balanced output terminal, it is possible to freely set the impedance of the reception-side balanced output terminal by an appropriate combination of the inductor and the capacitors. Moreover, since the inductor and the capacitors are integrated in a laminated block with other circuit components, as compared to where the inductor and the capacitors are discretely arranged on a printed-circuit board, the mounting area on the printed-circuit board is reduced, the distance between the surface acoustic wave filter and the matching element is minimized, and the loss between the filter and the matching element is suppressed to improve high-frequency characteristics.

An important consideration when the switch, the LC filter, the surface acoustic wave filter, and the matching element are integrated in a laminated block having a plurality of dielectric layers laminated is to arrange the components such that interference between the matching element and the LC filter is prevented. In particular, regarding the inductance of the matching element, a high Q value and stability are required.

In a high-frequency composite component according to this preferred embodiment of the present invention, it is desirable that the inductor of the matching element be disposed in a first area of the laminated block, and that the inductor and the capacitors of the LC filter be disposed in a second area different from the first area as viewed from the top.

In the same manner, it is desirable that the inductor of the matching element be disposed on the surface of the laminated block and that the inductor and the capacitors of the LC filter be disposed inside the laminated block. Furthermore, it is desirable that a ground electrode be disposed between the inductor of the matching element and the inductor and the capacitors of the LC filter. Alternatively, it is desirable that a shunt capacitor of the capacitors of the LC filter be disposed in the vicinity of the lowest layer of the laminated block.

The inductor and the capacitors of the matching element are disposed on the surface of the laminated block, and the inductor of the matching element may be disposed so as to be directly next to the capacitors of the matching element with no other elements disposed therebetween.

Furthermore, the surface acoustic wave filter may be a balanced-type surface acoustic wave filter having balanced output ports or the surface acoustic wave filter may be an unbalanced-type surface acoustic wave filter having unbalanced output ports. When the surface acoustic wave filter is a balanced-type filter, the inductor of the matching element is connected in parallel between the balanced output ports, and the capacitors of the matching element are connected in series to the balanced output ports. Furthermore, when the surface acoustic wave filter is an unbalanced-type filter, the inductor and the capacitors of the matching element function as a balun.

Moreover, a high-frequency composite component according to a preferred embodiment of the present invention is a high-frequency composite component of a dual-band type in which signals in two different frequency bands can be processed. In such a high-frequency composite component of a dual-band type, a diplexer for branching a signal path for a first frequency band and a signal path for a second frequency band different from the first frequency band is provided at the rear stage of the antenna terminal. In the signal path for a first frequency band, a first switch for selectively switching a signal path between the antenna terminal and a first transmission-side input terminal and a signal path between the antenna terminal and a first reception-side balanced output terminal, a first LC filter having an inductor and capacitors disposed between the first switch and the first transmission-side input terminal, a first surface acoustic wave filter disposed between the first switch and the first reception-side balanced output terminal, and a first matching element having an inductor and capacitors disposed between the first surface acoustic wave filter and the first reception-side balanced output terminal are provided. In the signal path for a second frequency band, a second switch for selectively switching a signal path between the antenna terminal and a second transmission-side input terminal and a signal path between the antenna terminal and a second reception-side balanced output terminal, a second LC filter having inductors and capacitors disposed between the second switch and the second transmission-side input terminal, a second surface acoustic wave filter disposed between the second switch and the second reception-side balanced output terminal, and a second matching element having an inductor and capacitors disposed between the second surface acoustic wave filter and the second reception-side balanced output terminal are provided. The diplexer, the first and second switches, the first and second LC filters, the first and second surface acoustic wave filters, and the first and second matching elements are integrated in a laminated block having a plurality of laminated dielectric layers.

A high-frequency composite component according to another preferred embodiment of the present invention is a high-frequency composite component of a triple-band type in which signals in three different frequency bands can be processed. In such a high-frequency composite component of a triple-band type, a diplexer for branching a signal path for a first frequency band and a signal path for a second frequency band different from the first frequency band is provided at the rear stage of the antenna terminal. In the signal path for a first frequency band, a first switch for selectively switching a signal path between the antenna terminal and a first transmission-side input terminal and a signal path between the antenna terminal and a first reception-side balanced output terminal, a first LC filter having an inductor and capacitors disposed between the first switch and the first transmission-side input terminal, a first surface acoustic wave filter disposed between the first switch and the first reception-side balanced output terminal, and a first matching element having an inductor and capacitors disposed between the first surface acoustic wave filter and the first reception-side balanced output terminal are provided. In the signal path for a second frequency band, a second switch for selectively switching a signal path between the antenna terminal and a second transmission-side input terminal and a signal path between the antenna terminal and second and third reception-side balanced output terminals, a second LC filter having inductors and capacitors disposed between the second switch and the second transmission-side input terminal, a duplexer branching a signal path disposed between the second switch and the second reception-side balanced output terminal and a signal path disposed between the second switch and the third reception-side balanced output terminal, a second surface acoustic wave filter disposed between the duplexer and the second reception-side balanced output terminal, a second matching element having an inductor and capacitors disposed between the second surface acoustic wave filter and the second reception-side balanced output terminal, a third surface acoustic wave filter disposed between the duplexer and the third reception-side balanced output terminal, and a third matching element having an inductor and capacitors disposed between the third surface acoustic wave filter and the third reception-side balanced output terminal are provided. The diplexer, the first and second switches, the first and second LC filters, the first, second, and third surface acoustic wave filters, and the first, second, and third matching elements are integrated in a laminated block having a plurality of laminated dielectric layers.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the preferred embodiments of a high-frequency composite component according to the present invention are described with reference to the accompanied drawings.

Figure 1:
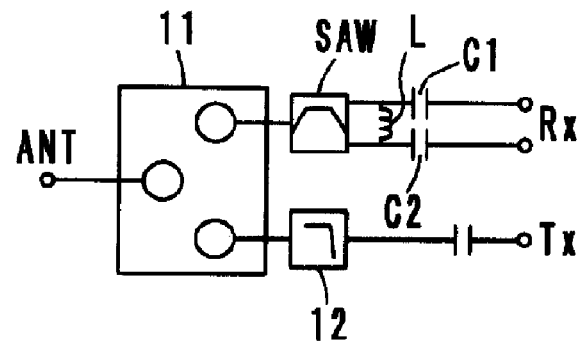
FIG. 1 is a block diagram showing the basic structure of a first preferred embodiment of a high-frequency composite component according to the present invention.
Figure 2:
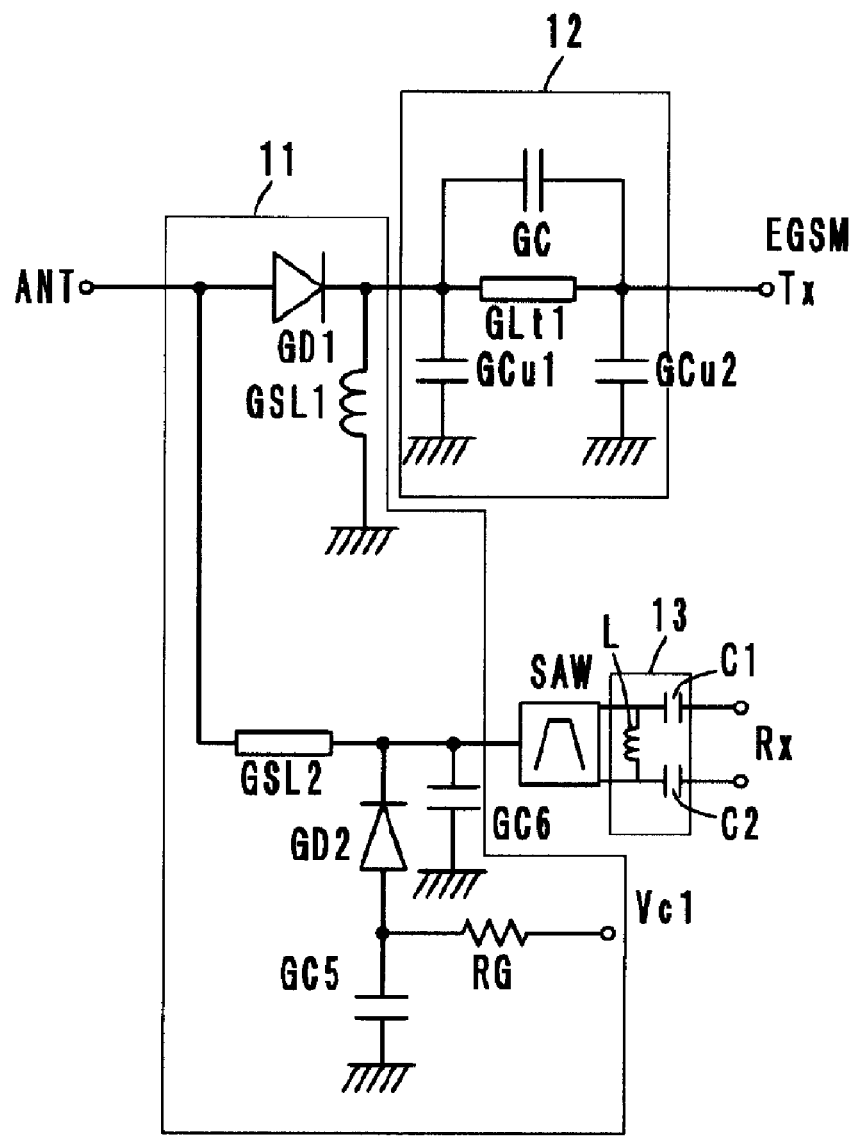
FIG. 2 is an equivalent circuit diagram of the first preferred embodiment.

First Preferred Embodiment (FIGS. 1 and 2)

In a high-frequency composite component of a single-band type according to the first preferred embodiment, as shown in a block diagram of FIG. 1, an inductor L is connected in parallel between the balanced output portion of a balanced-typed surface acoustic wave filter SAW and the reception-side balanced output terminal Rx, and capacitors C1 and C2 are connected in series, respectively.

In detail, as shown in an equivalent circuit diagram of FIG. 2, the high-frequency composite component includes a high-frequency switch 11, an LC filter 12, a balanced-type surface acoustic wave filter SAW, and a matching element 13.

The high-frequency switch 11 is for selectively switching a signal path between an antenna terminal ANT and a transmission-side input terminal Tx and a signal path between the antenna terminal ANT and a reception-side balanced output terminal Rx. The LC filter 12 is disposed between the high-frequency switch 11 and the transmission-side input terminal Tx and is a low-pass filter including an inductor GLt1 and capacitors. The capacitors of the low-pass filter include a capacitor GC connected in parallel to the inductor GLt1 and two grounding capacitors (shunt capacitors) GCu1 and GCu2 connected to the ground.

In the matching element 13, as described above, the inductor L is connected in parallel and the capacitors C1 and C2 are connected in series, respectively, between the balanced output portion of the surface acoustic wave filter SAW and the reception-side balanced output terminal Rx.

Furthermore, in the first preferred embodiment, the above-described high-frequency switch 11, LC filter 12, surface acoustic wave filter SAW, and matching element 13 are integrated in a laminated block in which a plurality of dielectric layers are laminated.

The high-frequency composite component according to the first preferred embodiment, which is a single-band type, is included in high-frequency composite components of second and third preferred embodiments of a dual-band type and a high-frequency composite component of a fourth preferred embodiment of a triple-band type as a component thereof. Accordingly, the more detailed structure and operation of the first preferred embodiment are disclosed with reference to the second, third, fourth, fifth, and sixth preferred embodiments to be described later.

Second Preferred Embodiment (FIGS. 3 to 8)

Figure 3:
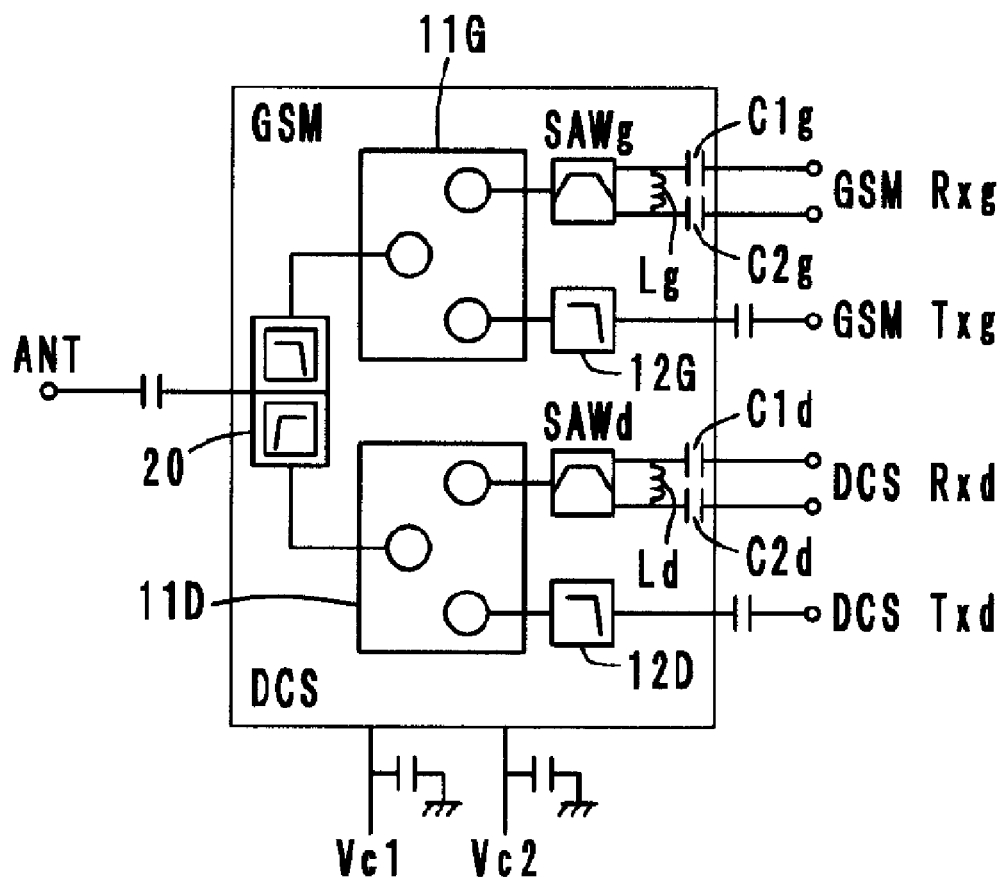
FIG. 3 is a block diagram showing the basic structure of a second preferred embodiment of a high-frequency composite component of the present invention.

A high-frequency composite component according to the second preferred embodiment is a high-frequency composite component (front-end module) of a dual-band type having GSM and DCS systems, as shown in a block diagram in FIG. 3. Inductors Lg and Ld are connected in parallel between the balanced output portions of balanced-type surface acoustic wave filters SAWg and SAWd and reception-side balanced output terminals Rxg and Rxd, and capacitors C1g and C2g, and C1d and C2d are connected in series, respectively.

Figure 4:
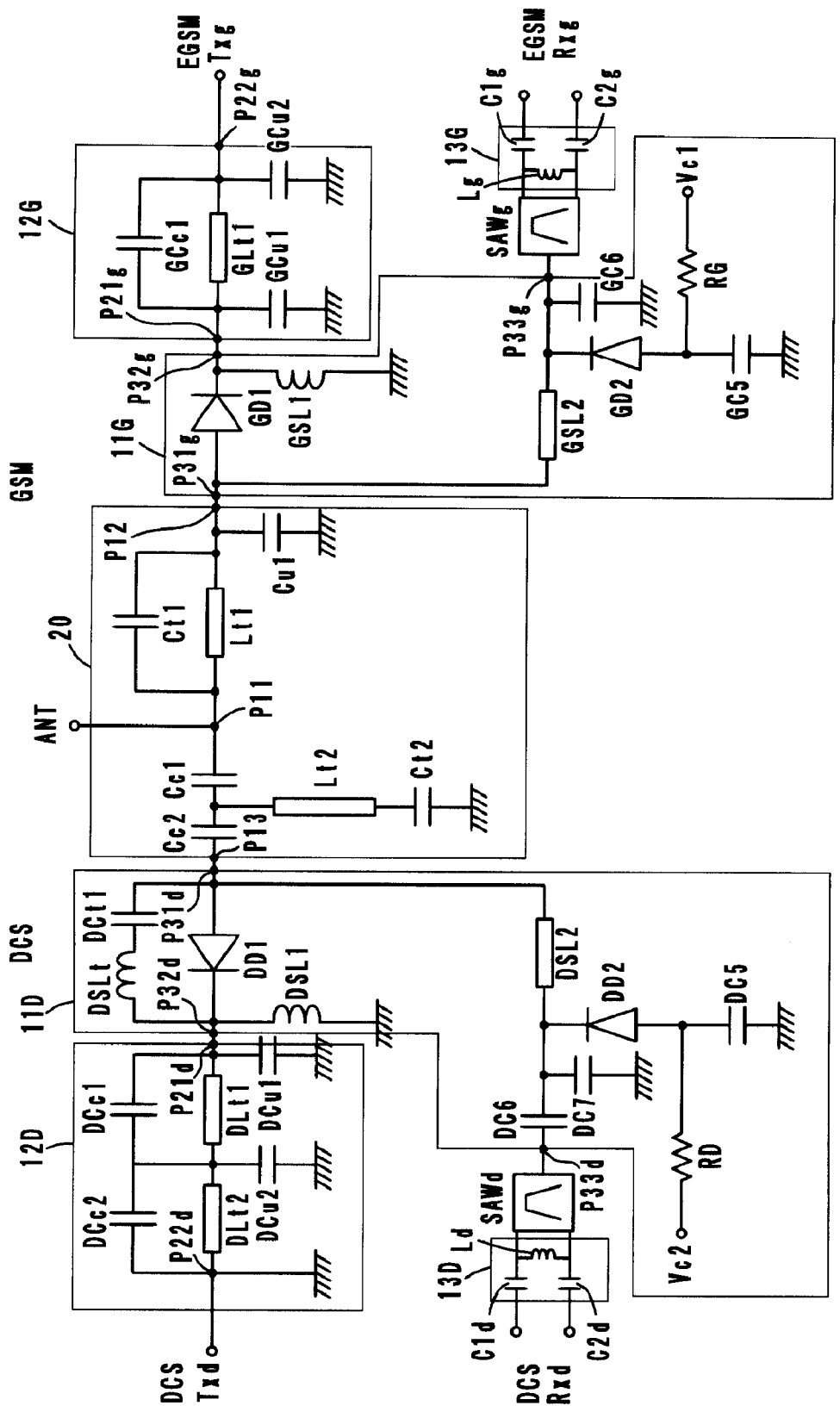
FIG. 4 is an equivalent circuit diagram of the second preferred embodiment.

In detail, as shown in an equivalent circuit diagram of FIG. 4, the high-frequency composite component includes a diplexer 20 for branching a GSM-system signal path and a DCS-system signal path at the rear stage of the antenna terminal ANT. Moreover, the GSM system includes a first high-frequency switch 11G, a first LC filter 12G, the first balanced-type surface acoustic wave filter SAWg, and a first matching element 13G. In the same manner, the CS system also includes a second high-frequency switch 11D, a second LC filter 12D, the second balanced-type surface acoustic wave filter SAWd, and a second matching element 13D.

The first high-frequency switch 11G selectively switches a signal path between the antenna terminal ANT and a first transmission-side input terminal Txg and a signal path between the antenna terminal ANT and a first reception-side balanced output terminal Rxg. The first LC filter 12G is disposed between the first high-frequency switch 11G and the first transmission-side input terminal Txg. The first surface acoustic wave filter SAWg is disposed between the first high-frequency switch 11G and the first reception-side balanced output terminal Rxg.

In the first matching element 13G, the inductor Lg is connected in parallel on the side of the first surface acoustic wave filter SAWg, and the capacitors C1g and C2g are connected in series between the inductor Lg and the reception-side balanced output terminal Rxg, respectively.

The second high-frequency switch 11D selectively switches a signal path between the antenna terminal ANT and a second transmission-side input terminal Txd and a signal path between the antenna terminal ANT and a second reception-side balanced output terminal Rxd. The second LC filter 12D is disposed between the second high-frequency switch 11D and the second transmission-side input terminal Txd. The second surface acoustic wave filter SAWd is disposed between the second high-frequency switch 11D and the second reception-side balanced output terminal Rxd.

In the second matching element 13D, an inductor Ld is connected in parallel on the side of the second surface acoustic wave filter SAWd, and the capacitors C1d and C2d are connected in series between the inductor Ld and the reception-side balanced output terminal Rxd, respectively.

The diplexer 20 selects a transmission signal from the DCS system or the GSM system during transmission and selects a reception signal to the DCS system or the GSM system during reception. The antenna terminal ANT is connected to a first port P11 of the diplexer 20, the first port P31g of the first high-frequency switch 11G is connected to a second port P12, and the first port P31d of the second high-frequency switch 11D is connected to a third port P13.

In the GSM system, a first port P21g of the first LC filter 12G is connected to a second port P32g of the first high-frequency switch 11G, and the first surface acoustic wave filter SAWg is connected to a third port P33g. The first transmission-side input terminal Txg is connected to a second port P22g of the first LC filter 12G.

In the DCS system, a first port P21d of the second LC filter 12D is connected to a second port P32d of the second high-frequency switch 11D, and the second surface acoustic wave filter SAWd is connected to a third port P33d. The transmission-side second input terminal Txd is connected to a second port P22d of the second LC filter 12D.

The diplexer 20 includes inductors Lt1 and Lt2, and capacitors Cc1, Cc2, Ct1, Ct2, and Cu1. A parallel circuit defined by the inductor Lt1 and the capacitor Ct1 is connected between the first port P11 and the second port P12, and the side of the second port P12 of the parallel circuit is grounded through the capacitor Cu1. Furthermore, the capacitors Cc1 and Cc2 are connected in series between the first port P11 and the third port P13, and the connection point between them is grounded through the inductor Lt2 and the capacitor Ct2.

The first high-frequency switch 11G includes diodes GD1 and GD2 as switching elements, inductors GSL1 and GSL2, capacitors GC5 and GC6, and a resistor RG. The diode GD1 is connected between the first port P31g and the second port P32g such that the anode is on the side of the first port P31g, and the cathode is grounded through the inductor GSL1. The cathode of the diode GD2 is connected to the first port P31g through the inductor GSL2, and the anode is grounded through the capacitor GC5. A control terminal Vc1 is connected to the connection point between the diode GD2 and the capacitor GC5 through the resistor RG. Furthermore, the connection point between the cathode of the diode GD2 and the third port P33g is grounded through the capacitor GC6.

The second high-frequency switch 11D includes diodes DD1 and DD2 as switching elements, inductors DSL1, DSL2, and DSLt, capacitors DC6, DC7, and DCt1, and a resistor RD. The diode DD1 is connected between the first port P31d and the second port P32d such that the anode is on the side of the first port P31d, and the cathode is grounded through the inductor DSL1. Furthermore, a series circuit of the capacitor DCt1 and the inductor DSLt is connected in parallel to the diode DD1 between the first port P31d and the second port P32d. The cathode of the diode DD2 is connected to the first port P31d through the inductor DSL2, and the anode is grounded through the capacitor DC5. A control terminal Vc2 is connected to the connection point between the diode DD2 and the capacitor DC5 through the resistor RD. Furthermore, the cathode of the diode DD2 is connected to the third port P33d through the capacitor DC6, and the connection point between the cathode and the capacitor DC6 is grounded through the capacitor DC7.

In the first LC filter 12G, a parallel circuit of an inductor GLt1 and a capacitor GCc1 is connected between the first port P21g and the second port P22g. Both ends of the inductor GLt1 are grounded through capacitors GCu1 and GCu2, respectively.

In the second LC filter 12D, a parallel circuit of an inductor DLt1 and a capacitor DCc1 and a parallel circuit of an inductor DLt2 and a capacitor DCc2 are connected in series between the first port P21d and the second port P22d. Both ends of the inductor DLt1 are grounded through capacitors DCu1 and DCc2, respectively.

Figure 5:
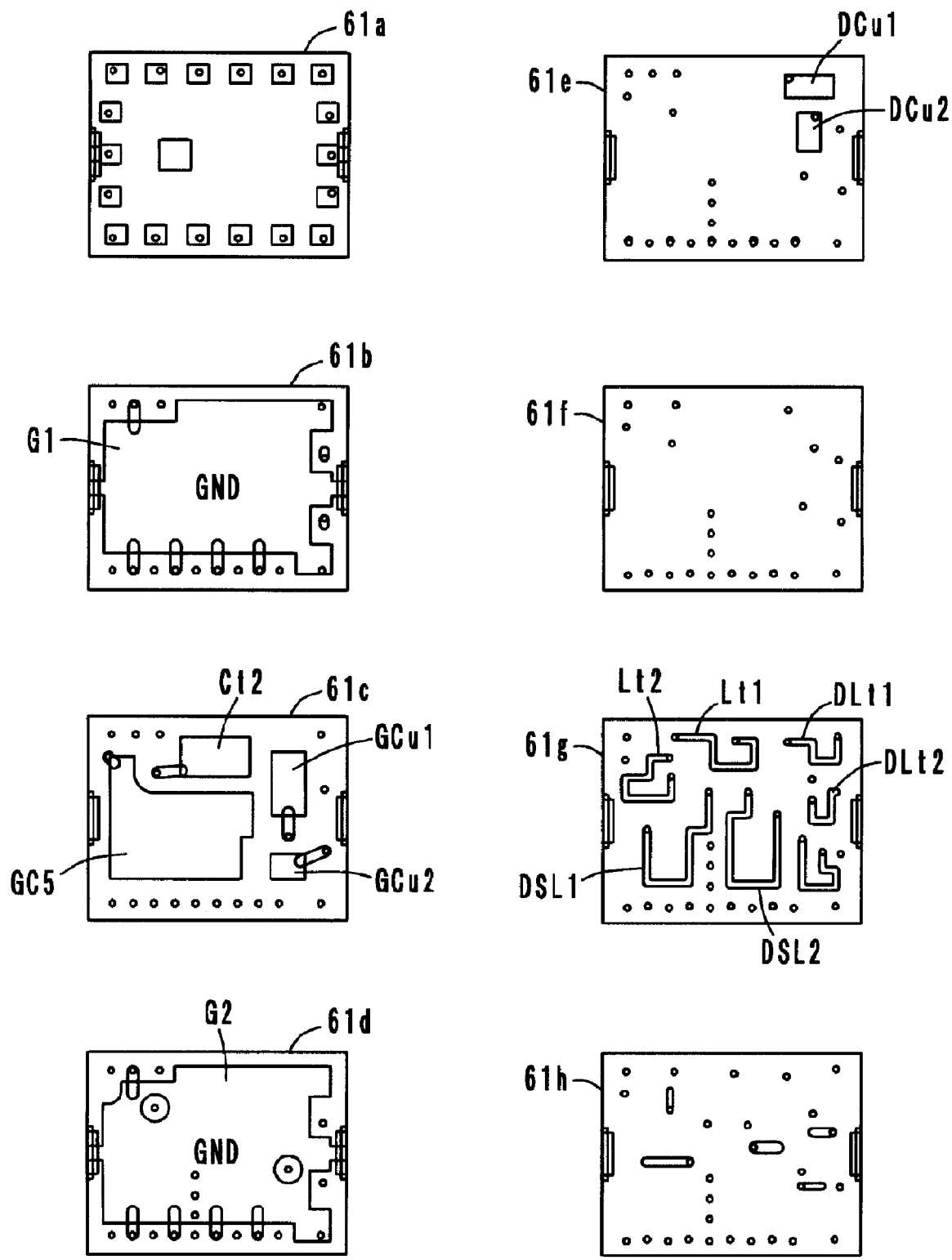
FIG. 5 is a schematic illustration showing the shape of electrodes provided on each sheet layer (first to eighth layers from the bottom) of a ceramic multilayer substrate of the second preferred embodiment.
Figure 6:
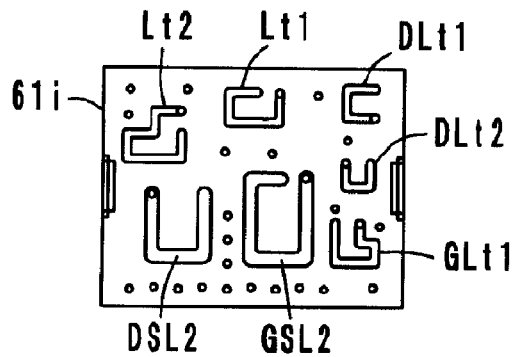
FIG. 6 is a schematic illustration showing the shape of electrodes provided on each sheet layer (ninth to fifteenth layers from the bottom) of a ceramic multilayer substrate of the second preferred embodiment.
Figure 6:
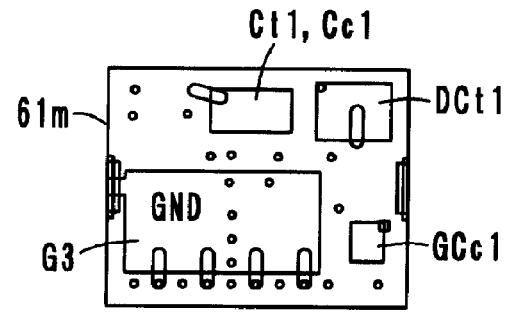
Figure 6:
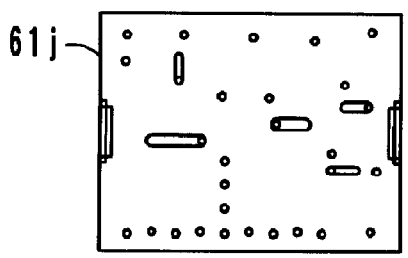
Figure 6:
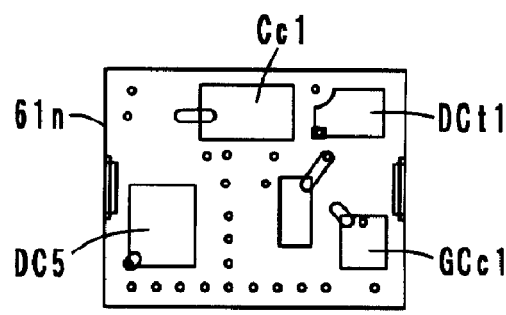
Figure 6:
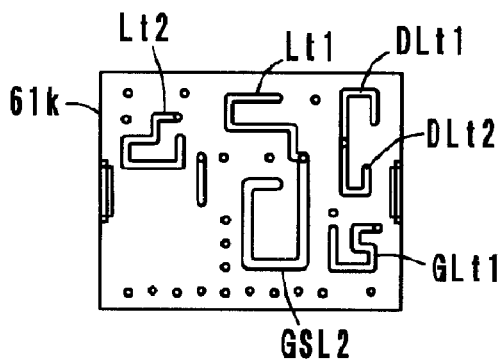
Figure 6:
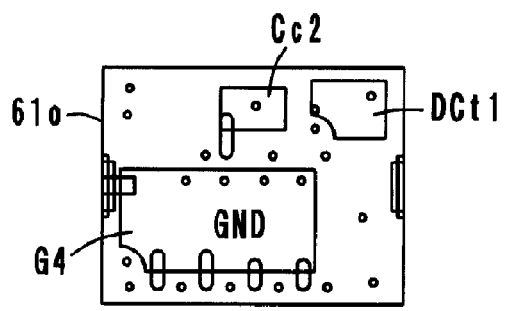
Figure 6:
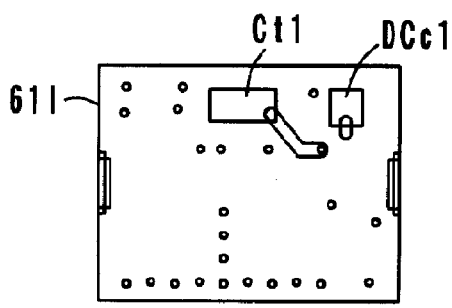
Figure 7:
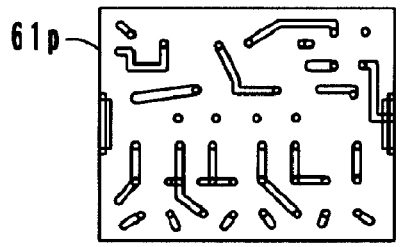
FIG. 7 is a schematic illustration showing the shape of electrodes provided on each sheet layer (sixteenth and seventeenth layers from the bottom) of a ceramic multilayer substrate of the second preferred embodiment.
Figure 7:
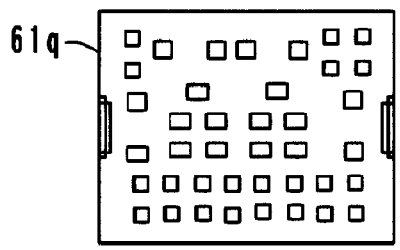

FIGS. 5 to 7 show capacitor electrodes and strip line electrodes formed by screen printing or other suitable method, on each sheet layer defining a ceramic multilayer substrate of a high-frequency composite component according to the second preferred embodiment. The ceramic multilayer substrate is formed such that first to seventeenth sheet layers 61a to 61q made of ceramics having barium oxide, aluminum oxide, and silica as main components are laminated in order from the bottom and sintered at a temperature of about 1000° C. or less.

Various terminal electrodes for external connection are provided on the first sheet layer 61a. A ground electrode G1 is provided on the second sheet layer 61b, the electrodes for the capacitors GCu1, GCu2, Ct2, and GC5 are provided on the third sheet layer 61c to define capacitances together with the ground electrode G1. A ground electrode G2 is provided on the fourth sheet layer 61d, and the electrodes for the capacitors DCu1 and DCu2 are provided on the fifth sheet layer 61e to define capacitances with the ground electrode G2.

The inductors Lt1, Lt2, DLt1, DLt2, GLt1, DSL1, and DSL2 are defined by stripline electrodes on the seventh and ninth sheet layers 61g and 61i and are connected by via holes. Moreover, the inductors Lt1, Lt2, DLt1, DLt2, GLt1, and DSL2 are defined by stripline electrodes on the eleventh sheet layer 61k and are connected to the same electrodes on the lower layers by via holes.

The electrodes of the capacitors Ct1 and DCc1 are provided on the twelve sheet layer 61l, and the electrodes of the capacitors Ct1, Cc1, DCt1, and GCc1 and the ground electrode G3 are provided. The electrodes of the capacitors Cc1, DCt1, GCc1, and DC5 are provided on the fourteenth sheet layer 61n. The electrodes of the capacitors Cc2 and DCt1 and the ground electrode G4 are provided on the fifteenth sheet layer 61o.

Figure 8:
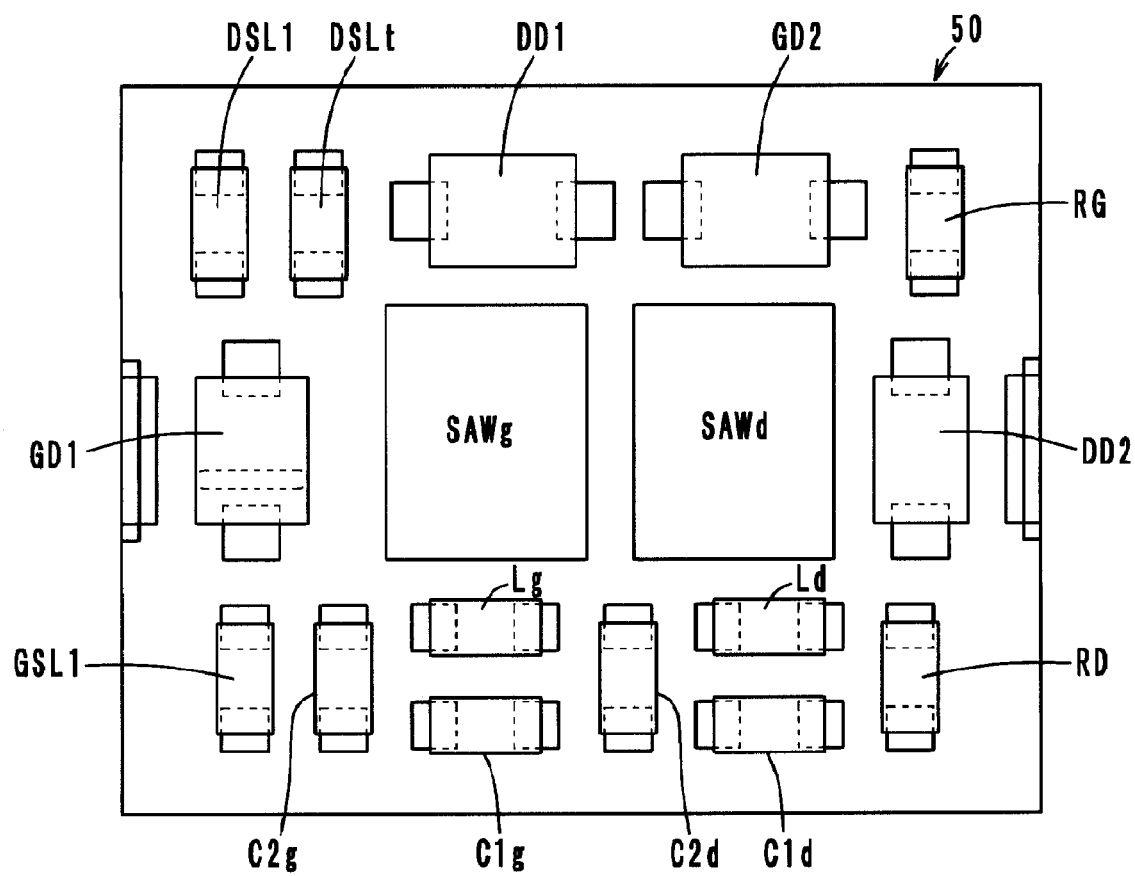
FIG. 8 is a top view showing the mounting state of each circuit element on the surface of the ceramic multilayer substrate of the second preferred embodiment.

As shown in FIG. 8, various connection terminal electrodes are provided on the surface of the seventeenth sheet layer 61q defining the surface of the ceramic multilayer substrate 50. Then, on the surface, the first and second surface acoustic wave filters SAWg and SAWd and the diodes GD1, GD2, DD1, and DD2 are mounted, and the inductor Lg and the capacitors C1g and C2g defining the first matching element 13G and the inductor Ld and the capacitors C1d and C2d defining the second matching element 13D are mounted. Moreover, the resistors RG and RD and the inductors DSL1, DSLt, and GSL1 are mounted on the surface of the ceramic multilayer substrate 50.

Here, the operation of the high-frequency composite component having the circuit structure shown in FIG. 4 is described. First, when a transmission signal of the DCS system (1.8 MHz band) is sent, in the second high-frequency switch 11D, the transmission signal of the DCS system passes through the second LC filter 12D, the second high-frequency switch 11D, and the diplexer 20 and is transmitted from the antenna terminal ANT connected to the first port P11 of the diplexer 20 such that, for example, about 3 V is applied to the control terminal Vc2 to turn on the diodes DD1 and DD2.

At this time, in the first high-frequency switch 11G of the GSM system, the transmission signal of the GSM system is not transmitted such that, for example, 0 V is applied to the control terminal Vc1 to turn off the diode GD1. Furthermore, the transmission signal of the DCS system does not enter the first transmission-side input terminal Txg and the first reception-side balanced output terminal Rxg of the GSM system due to the connection of the diplexer 20. Moreover, the second and third harmonics of the DCS system are attenuated in the second LC filter 12D of the DCS system.

Next, when a transmission signal of the GSM system (900 MHz band) is sent, in the first high-frequency switch 11G, the transmission signal of the GSM system passes through the first LC filter 12G, the first high-frequency switch 11G, and the diplexer 20 and is transmitted from the antenna terminal ANT connected to the first port P11 of the diplexer 20 such that, for example, about 3 V is applied to the control terminal Vc1 to turn on the diodes GD1 and GD2.

At this time, in the second high-frequency switch 11D of the DCS system, the transmission signal is not transmitted such that, for example, 0 V is applied to the control terminal Vc2 to turn off the diode DD1. Furthermore, the transmission signal of the GSM system does not enter the second transmission-side input terminal Txd and the second reception-side balanced output terminal Rxd of the DCS system due to the connection of the duplexer 20.

Moreover, the second harmonic of the GSM system is attenuated in the low-pass filter made up of the capacitor Ct1, the inductor Lt1, and the shunt capacitor Cu1 of the diplexer 20 and the third harmonic of the GSM system is attenuated in the first LC filter 12G of the GSM system.

Next, when reception signals of the DCS system and the GSM system are received, in the second high-frequency switch 11D of the DCS system, a reception signal of the DCS system does not enter the second transmission-side input terminal Txd such that, for example, 0 V is applied to the control terminal Vc2 to turn off the diodes DD1 and DD2, and in the first high-frequency switch 11G of the GSM system, a reception signal of the GSM system does not enter the first transmission-side input terminal Txg of the GSM system such that 0 V is applied to the control terminal Vc1 to turn off the diodes GD1 and GD2. Then, the signals input from the antenna terminal ANT are output to the reception-side balanced output terminal Rxd of the DCS system and the reception-side balanced output terminal Rxg of the GSM system, respectively.

Furthermore, the reception signal of the DCS system does not enter the GSM system and the reception signal of the GSM system does not enter the DCS system due to the connection of the diplexer 20.

In the high-frequency composite component according to the second preferred embodiment, since the matching elements 13G and 13D including the inductors Lg and Ld and the capacitors C1g, C2g, C1d, and C2d are disposed between the surface acoustic wave filters SAWg and SAWd and the reception-side balanced output terminals Rxg and Rxd, it is possible to freely set the impedance of the reception-side balanced output terminals Rxg and Rxd by appropriate combinations of the inductors and capacitors.

Furthermore, since the inductors Lg and Ld and the capacitors C1g, C2g, C1d, and C2d are integrated in the ceramic laminated substrate together with the other circuit components, as comparison to when such inductors and capacitors are discretely disposed on a printed circuit board, the mounting surface on the printed substrate is reduced and simultaneously the distance between the surface acoustic wave filters SAWg and SAWd and the matching elements 13G and 13D is minimized so as to suppress the loss between the filters SAWg and SAWd and the matching elements 13G and 13D and improve the high-frequency characteristics.

Furthermore, since the inductors Lg and Ld of the matching elements 13G and 13D are arranged so as not to overlap with the inductors and capacitors of the LC filters 12G and 12D in the ceramic laminated substrate as seen from the top, the isolation between the transmission and reception lines is secured and the mixture of a signal is prevented. Since the inductors Lg and Ld of the matching elements 13G and 13D are mounted on the surface of the ceramic laminated substrate, the same effect is attained by the inductors and capacitors of the LC filters 12G and 12D being disposed inside the ceramic laminated substrate.

Moreover, in the present preferred embodiment, the capacitors C1g, C2g, C1d, and C2d of the matching elements 13G and 13D are arranged so as not to overlap with the inductors and capacitors of the LC filters 12G and 12D as seen from the top. In this manner, the mixture of a signal between the transmission and reception lines is more effectively prevented.

Furthermore, since the ground electrode G4 is disposed between the inductors Lg and Ld of the matching elements 13G and 13D and the inductors and capacitors of the LC filters 12G and 12D, the interference between these components is effectively prevented. In addition, since the capacitors of the LC filters 12G and 12D, that is, the shunt capacitors GCu1, GCu2, DCu1, and DCu2, in particular, are disposed in the vicinity of the lower layer of the ceramic laminated substrate, the same effect is obtained. Since the inductors Lg and Ld and the capacitors C1g, Cg2, C1d, and C2d of the matching elements 13G and 13D are disposed on the surface of the ceramic laminated substrate, and since the inductors Lg and Ld of the matching elements 13G and 13D are arranged next to the capacitors C1g, C2g, C1d, and C2d of the matching elements 13G and 13D with no other elements disposed therebetween, mutual interference is effectively prevented.

Moreover, in the present preferred embodiment, the ground electrode G4 is also disposed between the capacitors C1g, C2g, C1d, and C2d and the inductors capacitors of the LC filters 12G and 12D. Thus, the interference between these components effectively prevented.

Furthermore, as shown in FIG. 8, on the surface of the ceramic multilayer substrate, the surface mounting components defining the matching elements 13G and 13D are disposed so as to be next to the surface mounting components defining the high-frequency switches 11G and 11D and the diplexer 20 through the surface acoustic wave filters SAWg and SAWd. With such an arrangement, the interference between the matching elements 13G and 13D and the other elements is more effectively suppressed.

Figure 9:
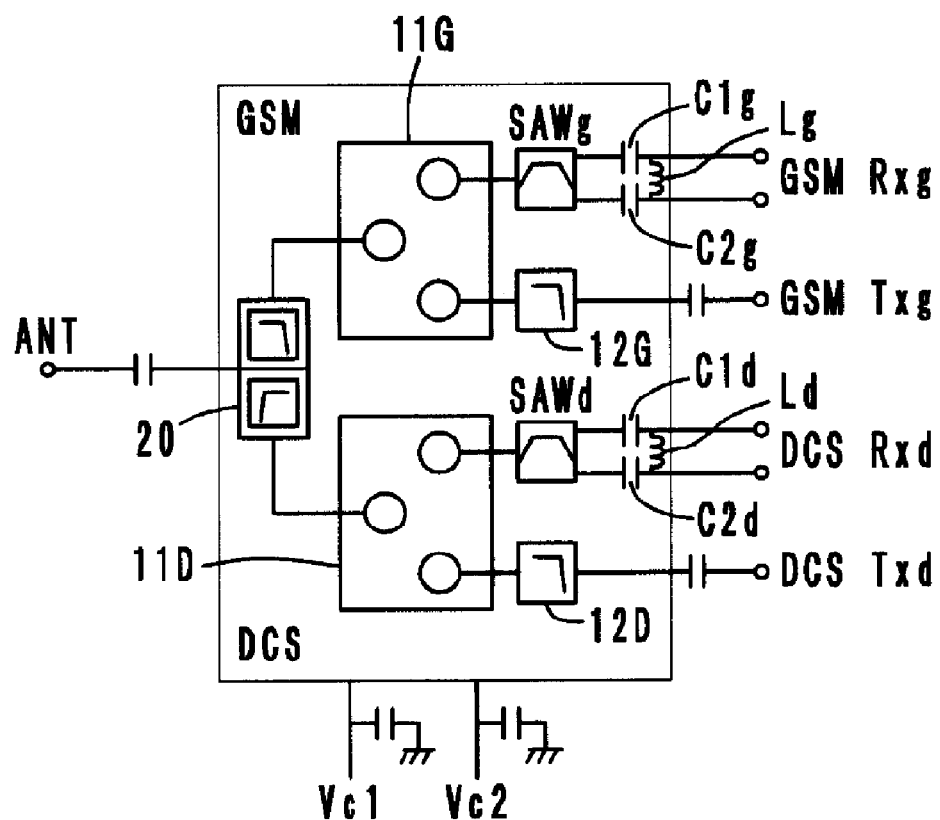
FIG. 9 is a block diagram showing the basic structure of a third preferred embodiment of a high-frequency composite component according to the present invention.
Figure 10:
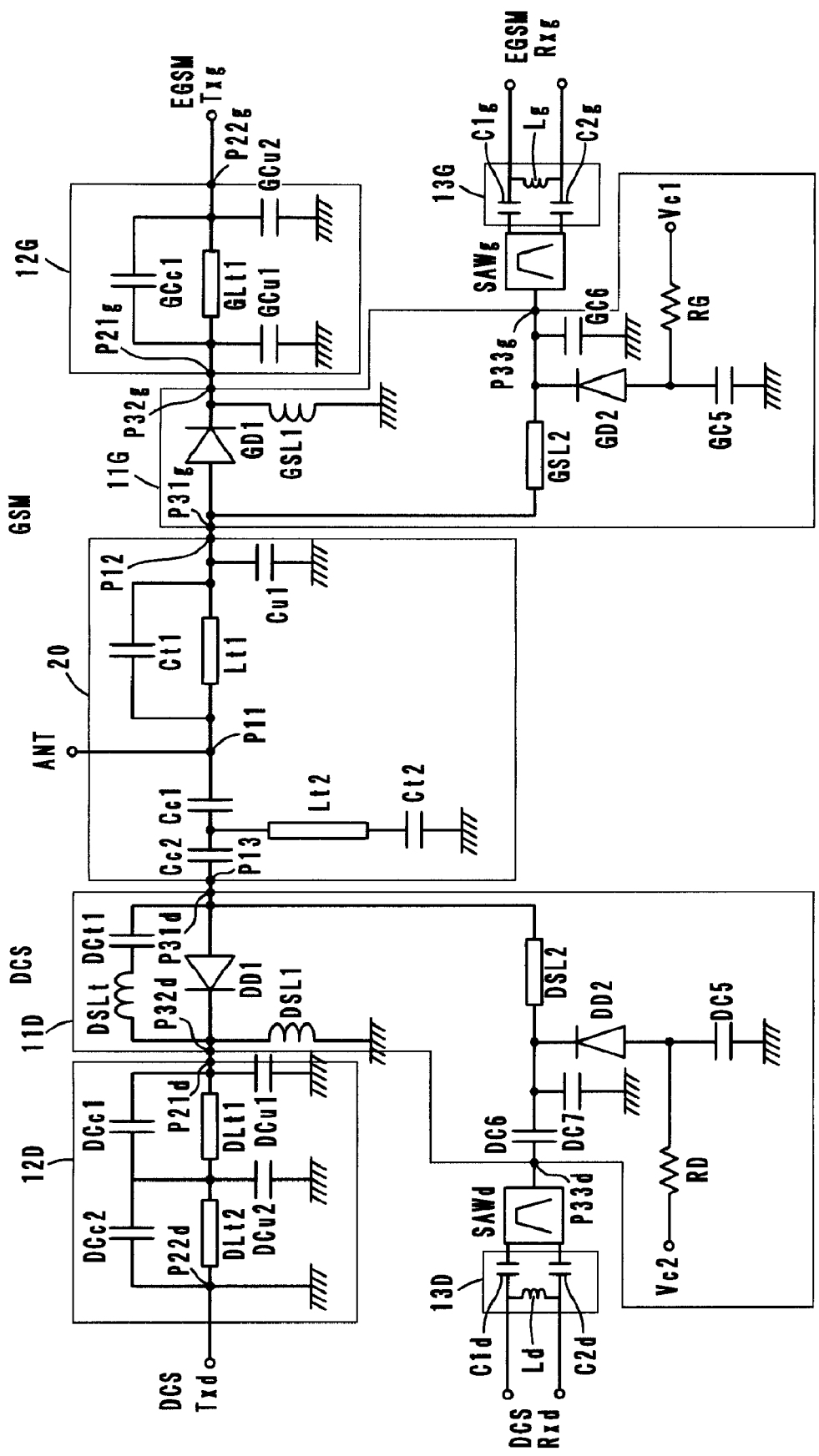
FIG. 10 is an equivalent circuit diagram of the third preferred embodiment.

Third Preferred Embodiment (FIGS. 9 and 10)

A high-frequency composite component according to a third preferred embodiment is a dual-band type high-frequency composite component having GSM and DCS systems similar to the second preferred embodiment. As shown in a block diagram in FIG. 9, the capacitors C1g and C2g, and Cd and C2d are connected in series to the balanced output portions of the balanced-type surface acoustic wave filters SAWg and SAWd, and the inductors Lg and Ld are connected in parallel to the reception-side balanced output terminals Rxg and RXd.

Thus, the impedance of the first and second reception-side balanced output terminals Rxg and Rxd can be freely set and the impedance can be increased, in particular, such that the capacitors C1g and C2g and the capacitors C1d and C2d are connected in series to the side of the first and second surface acoustic wave filters SAWg and SAWd, and the inductors Lg and Ld are connected in parallel to the side of the first and second reception-side balanced output terminals Rxg and Rxd, respectively.

Moreover, in the third preferred embodiment, the circuit structure and operation, except for the first and second matching elements 13G and 13D, are the same as in the second preferred embodiment and the overlapping description is omitted.

Fourth Preferred Embodiment (FIGS. 11 to 15)

Figure 11:
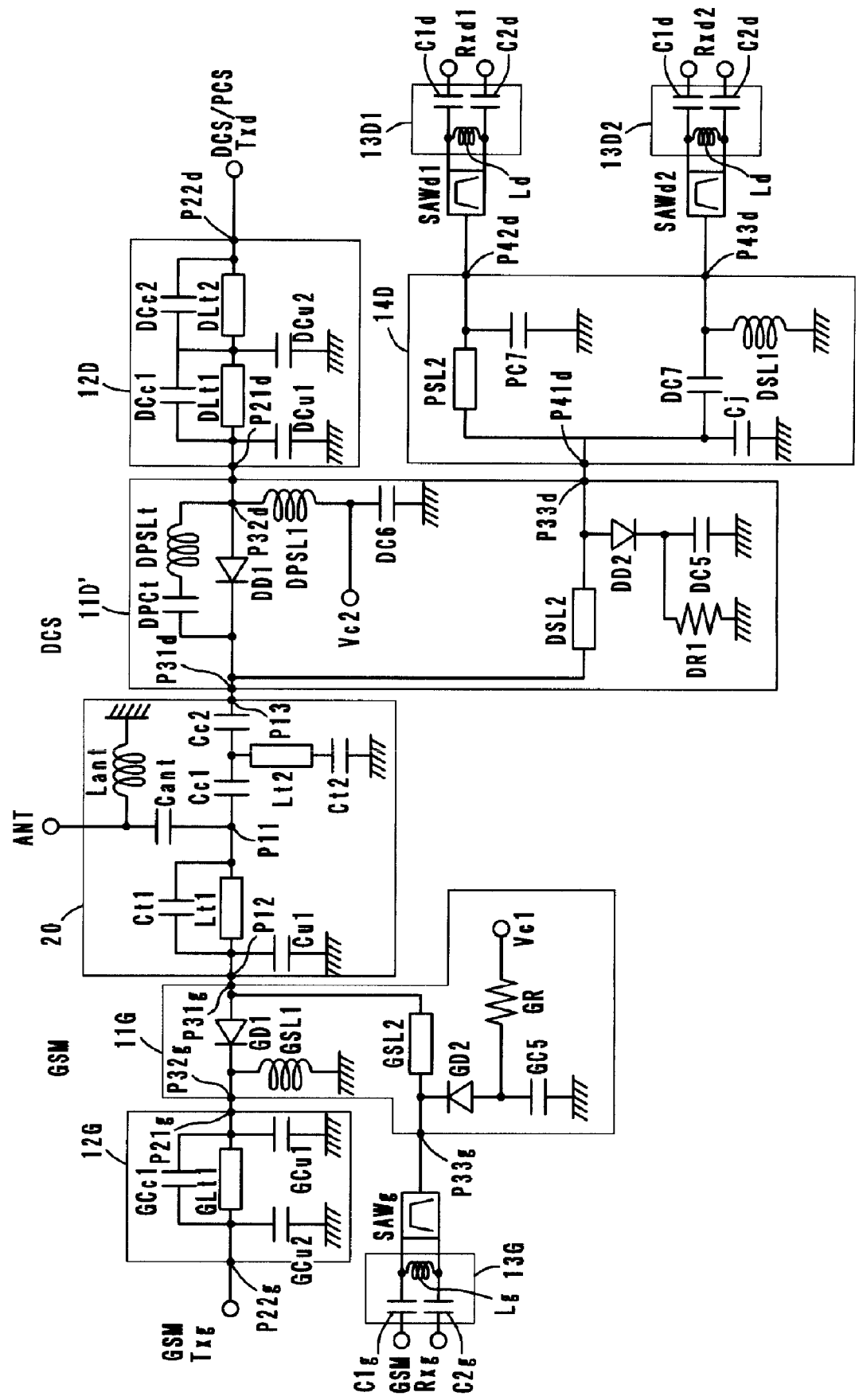
FIG. 11 is an equivalent circuit diagram of a fourth preferred embodiment of a high-frequency composite component according to the present invention.

A high-frequency composite component according to a fourth preferred embodiment is a triple-band type high-frequency composite component having a GSM system and a DCS system branching off into two reception-side balanced output terminals Rxd1 and Rxd2, as shown in an equivalent circuit diagram of FIG. 11.

That is, the GSM system includes a first high-frequency switch 11G, a first LC filter 12G, a balanced-type first acoustic wave filter SAWg, and a first matching element 13G. The structure and operation of the GSM system is the same as that in the above-described second and third preferred embodiments and the overlapping description is omitted.

The diplexer 20 also includes substantially the same structure as that in the second and third preferred embodiments and, in addition, a capacitor Cant is connected between the first port P11 and the antenna terminal ANT, and the connection point is grounded through an inductor Lant.

The DCS system includes a second high-frequency switch 11D', a second LC filter 12D, and a second transmission-side input terminal Txd. The circuit structure of this portion is the same as that in the second and third preferred embodiments and the overlapping description is omitted.

In the DCS system, the third port P33d of the second high-frequency switch 11D' is connected to a duplexer 14D, and the duplexer 14D branches the path of a reception signal into a second reception-side balanced output terminal Rxd1 and a third reception-side balanced output terminal Rxd2.

The second high-frequency switch 11D' selectively switches a signal path between the antenna terminal ANT and the second transmission-side input terminal Txd and a signal path between the antenna terminal ANT and the second and third reception-side balanced output terminals Rxd1 and Rxd2.

The second high-frequency switch 11D' includes the diodes DD1, and DD2 as switching elements, inductors DPSL1, DSL2, and DPSLt, capacitors DC5, DC6, DPCt, and a resistor DR1. The diode DD1 is connected between the first port P31d and the second port P32d such that the anode is on the side of the second port P32d, and the anode is grounded through the inductor DPSL1 and the capacitor DC6. The control terminal Vc2 is connected to the connection point between the inductor DPSL1 and the capacitor DC6. Furthermore, a series circuit of the capacitor DPCt and the inductor DPSLt is connected between the first port P31d and the second port P32d so as to be parallel to the diode DD. The anode of the diode DD2 is connected to the first port P31d through the inductor DSL2, and the cathode is grounded through the capacitor DC5. The connection point between the diode DD2 and the capacitor DC5 is grounded through the DR1.

In the duplexer 14D, an inductor PSL2 is connected between a first port P41d and a second port P42d, and the connection point between the inductor PSL2 and the second port P42d is grounded through a capacitor PC7. The second port P42d is connected to a second surface acoustic wave filter SAWd1. Furthermore, a capacitor DC7 is connected between the first port P41d and a third port P43d of the duplexer 14D. The connection point between the capacitor DC7 and the first port P41d is grounded through a capacitor Cj, and simultaneously, the connection point between the capacitor DC7 and the third port P43d is grounded through the inductor DSL1.

A second matching element 13D1 is connected to the balanced output portion of the second surface acoustic wave filter SAWd1, and a third matching element 13D2 is connected to the balanced output portion of a third surface acoustic wave filter SAWd2. In the second and third matching elements 13D1 and 13D2, in the same manner as in the second preferred embodiment, the inductors Ld are connected in parallel on the side of the surface acoustic wave filters SAWd1 and SAWd2, and the capacitors C2d and C2d are connected in series between the inductors Ld and the reception-side balanced output terminals Rxd1 and Rxd2, respectively. The operation-effect is the same as in the second preferred embodiment. Moreover, the second and third matching elements 13D1 and 13D2 may have the same circuit structure as in the third preferred embodiment, and in this case, the same operation effect is obtained as in the third preferred embodiment.

Figure 12:
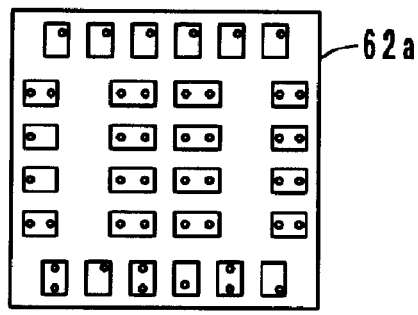
FIG. 12 is a schematic illustration showing the shape of electrodes provided on each sheet layer (first to eighth layers from the bottom) of a ceramic multilayer substrate of the fourth preferred embodiment.
Figure 12:
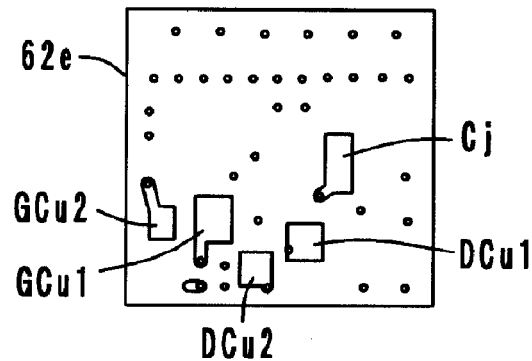
Figure 12:
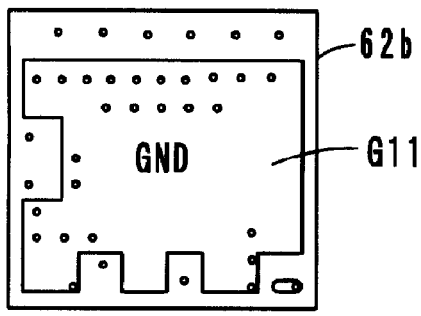
Figure 12:
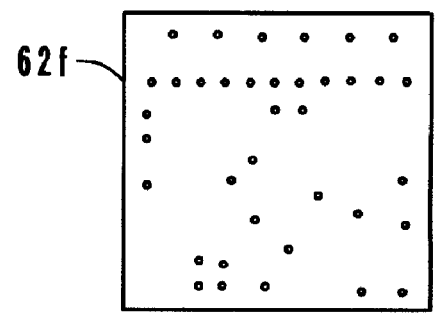
Figure 12:
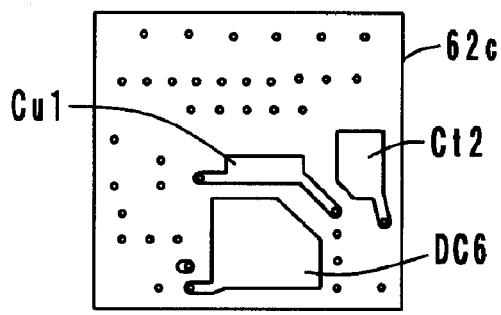
Figure 12:
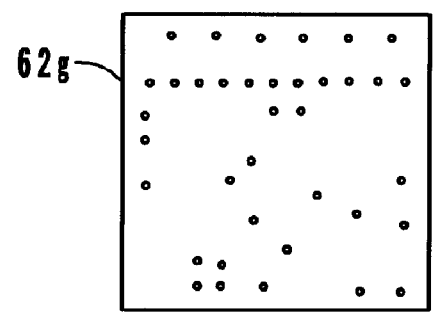
Figure 12:
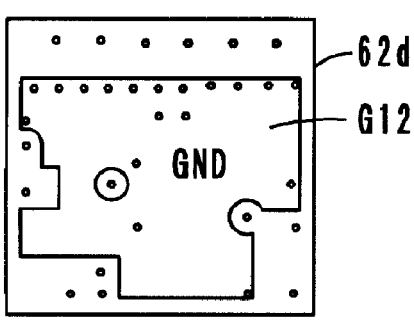
Figure 12:
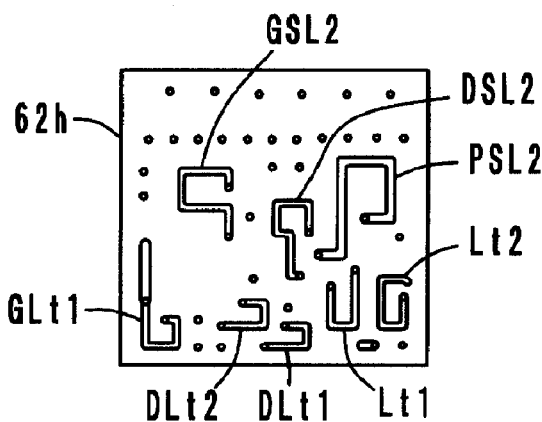
Figure 13:
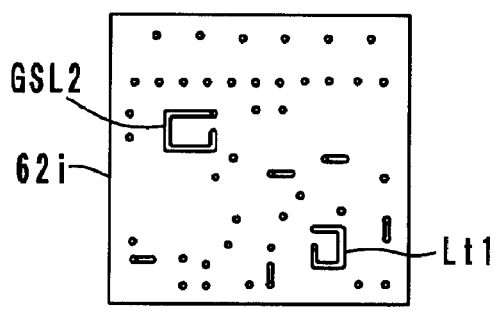
FIG. 13 is a schematic illustration showing the shape of electrodes provided on each sheet layer (ninth to fifteenth layers from the bottom) of a ceramic multilayer substrate of the fourth preferred embodiment.
Figure 13:
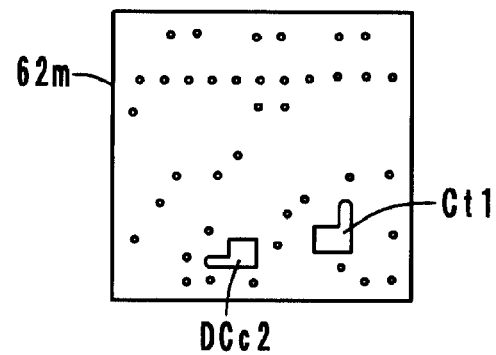
Figure 13:
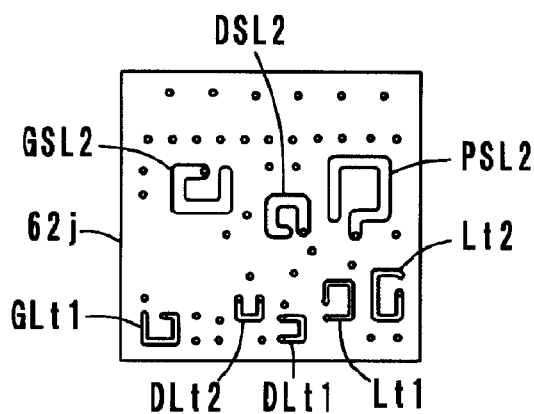
Figure 13:
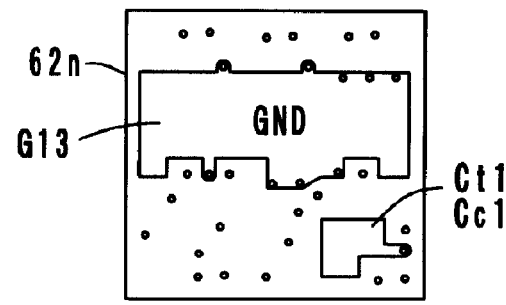
Figure 13:
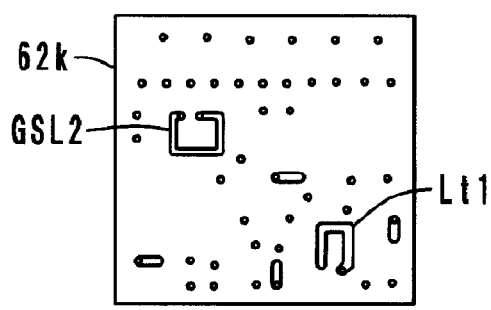
Figure 13:
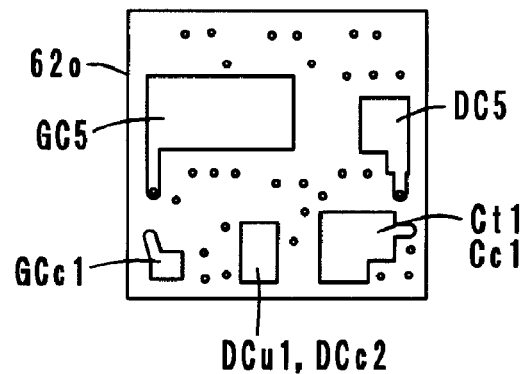
Figure 13:
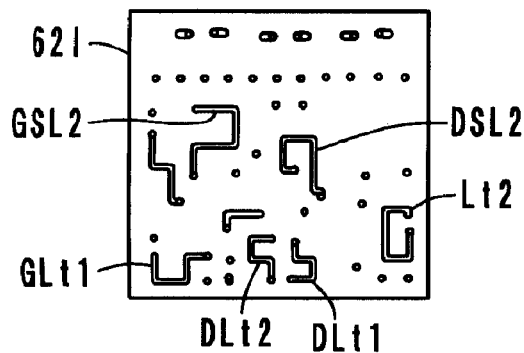
Figure 14:
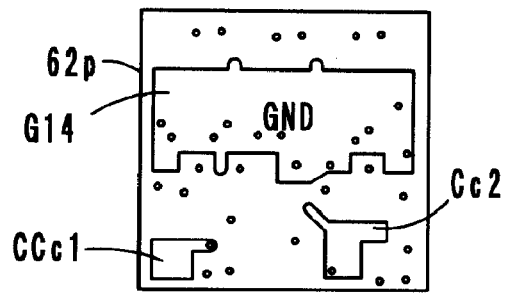
FIG. 14 is a schematic illustration showing the shape of electrodes provided on each sheet layer (sixteenth and seventeenth layers from the bottom) of a ceramic multilayer substrate of the fourth preferred embodiment.
Figure 14:
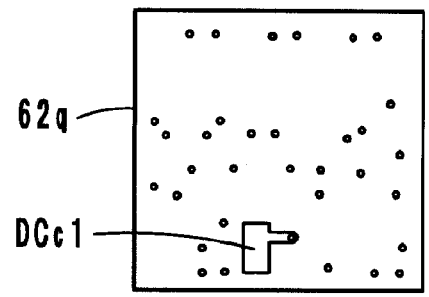
Figure 14:
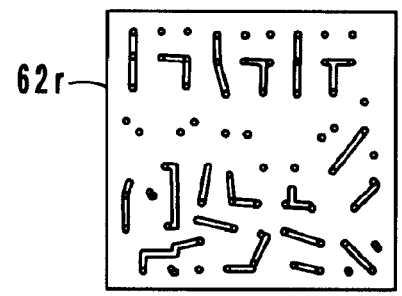
Figure 14:
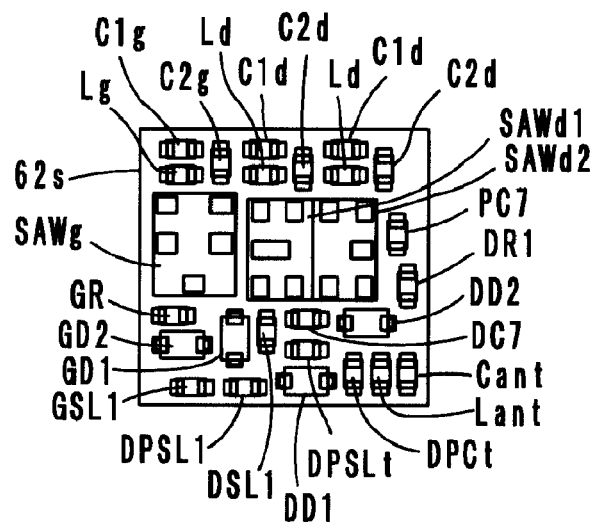

FIGS. 12 to 14 show the capacitor electrodes and stripline electrodes formed by a screen printing or other suitable method, on each sheet layer defining the ceramic multilayer substrate of a high-frequency composite component according to the fourth preferred embodiment.

Various external connection terminal electrodes are provided on the first sheet layer 62a. A ground electrode G11 is provided on the second sheet layer 62b, and the electrodes of capacitors Cu1, Ct2, and DC6 are provided on the third sheet layer 62c to define a capacitance together with the ground electrode G11. A ground electrode G12 is provided on the fourth sheet layer 62d, and the electrodes of capacitors DCu1, DCu2, Cj, GCu1, and GCu2 are provided on the fifth sheet layer 62e to define a capacitance together with the ground electrode G12.

The inductors Lt1, Lt2, DLt1, DLt2, GLt1, GSL2, DSL2, and PSL2 are provided on the eight sheet layer 62h using stripline electrodes. Inductors GSL2 and Lt1 are provided on the ninth sheet layer 62i using stripline electrodes and connected to the electrodes on lower layers through via holes.

The inductors Lt1, Lt2, DLt1, DLt2, GLt1, GSL2, DSL2, and DSL2 are provided on the tenth sheet layer 62j using stripline electrodes and connected to the electrodes of the same kind on lower layers through via holes. Inductors Lt1 and GSL2 are provided on the eleventh sheet layer 62k using stripline electrodes and connected to the electrodes of the same kind on lower layers through via holes.

The inductors Lt2, DLt1, DLt2, GLt1, GSL2, and DSL2 are provided on the twelve sheet layer 62l using stripline electrodes and connected to the electrodes of the same kind on lower layers through via holes. The electrodes of the capacitors Ct1 and DCc2 are provided on the thirteenth sheet layer 62m, and the electrodes of the capacitors Ct1 and Cc1 and the ground electrode G13 are provided on the fourteenth sheet layer 62n. The electrodes of the capacitors DC5, Ct1, Cc1, GCc1, GC5, DCu1, and DCc2 are provided on the fifteenth sheet layer 62o. The electrodes of the capacitors Cc2 and CCc1 and a ground electrode G14 are provided on the sixteenth sheet layer 62p. The electrodes of the capacitor DCc1 are provided on the seventeenth sheet layer 62q.

Figure 15:
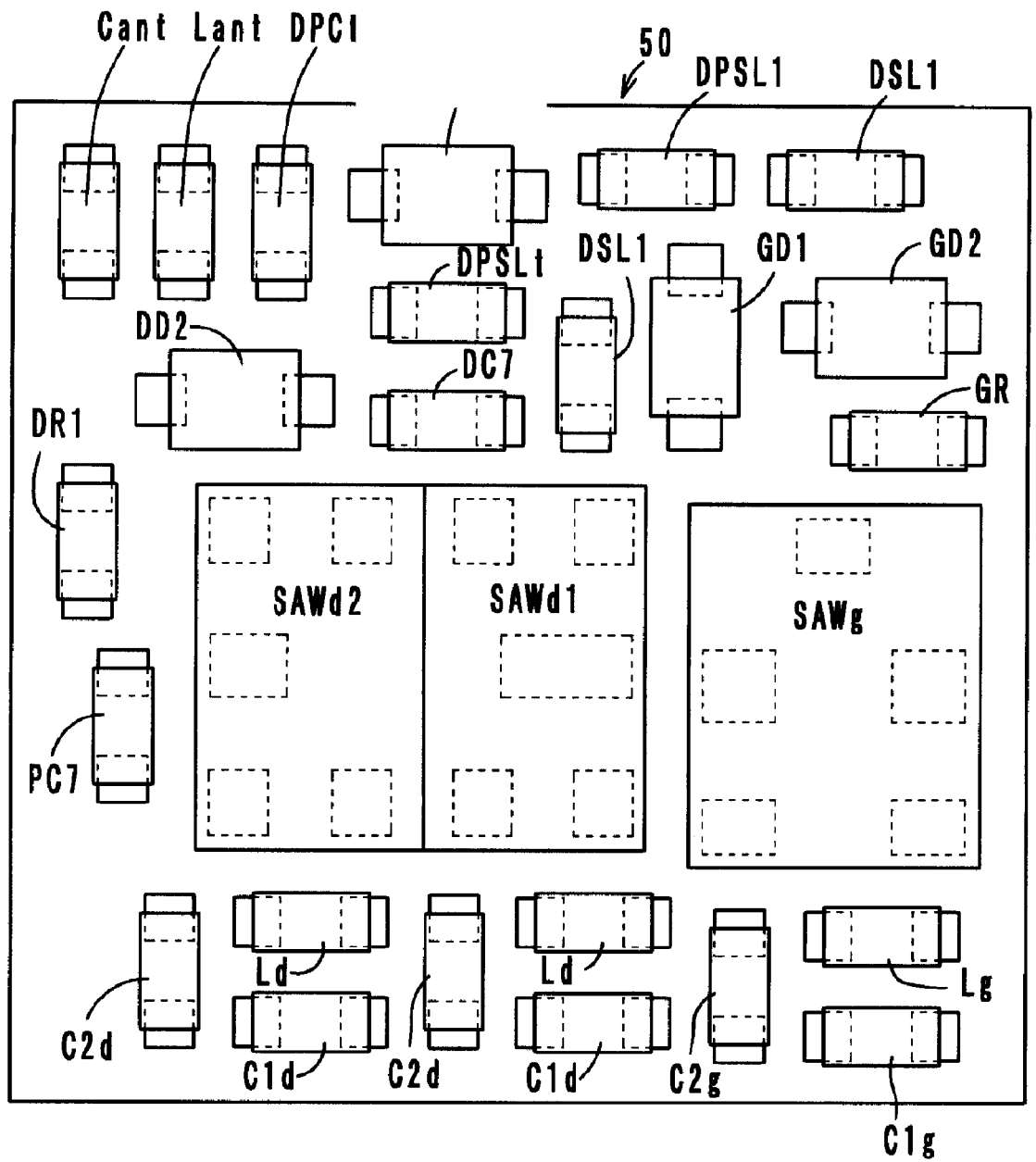
FIG. 15 is a top view showing the mounting state of each circuit element on the surface of the ceramic multilayer substrate of the fourth preferred embodiment.

The surface of the nineteenth sheet layer 62s is the surface of the ceramic multilayer substrate 50, as is shown in FIG. 15, and various connection terminal electrodes are provided and the first to third surface acoustic wave filters SAWg, SAWd1, and SAWd2 and the diodes GD1, GD2, DD1, and DD2 are mounted thereon. Moreover, the inductor Lg and the capacitors C1g and C2g defining the first matching element 13G and the inductor Ld and the capacitors C1d and C2d defining the second and third matching elements 13D1 and 13D2 are mounted thereon.

Moreover, on the surface of the ceramic multilayer substrate 50, the resistors RG and DR1 are mounted, the inductors Lant, DPCt, DPSLt, DSL1, and DPSL1 are mounted, and the capacitors Cant, DC7, and PC7 are mounted.

In the high-frequency composite according to the fourth preferred embodiment, a reception signal can be switched to the second reception-side balanced output terminal Rxd1 and the third reception-side balanced output terminal Rxd2 by turning on and off the diode of the second high-frequency switch 11D'. The other basic operations are the same as described in the second preferred embodiment and the operation effect is also the same as in the second preferred embodiment.

In particular, as shown in FIG. 15, on the surface of the ceramic multilayer substrate, the surface mounting components defining the matching elements 13G, 13D1, and 13D2 are disposed so as to be opposite to the surface mounting components defining the high-frequency switches 11G and 11D', the diplexer 20, and the duplexer 14D through the surface acoustic wave filters SAWg, SAWd1, and SAWd2. Such an arrangement further suppresses the interference between the matching elements 13G, 13D1, and 13D2 and the other elements.

Figure 16:
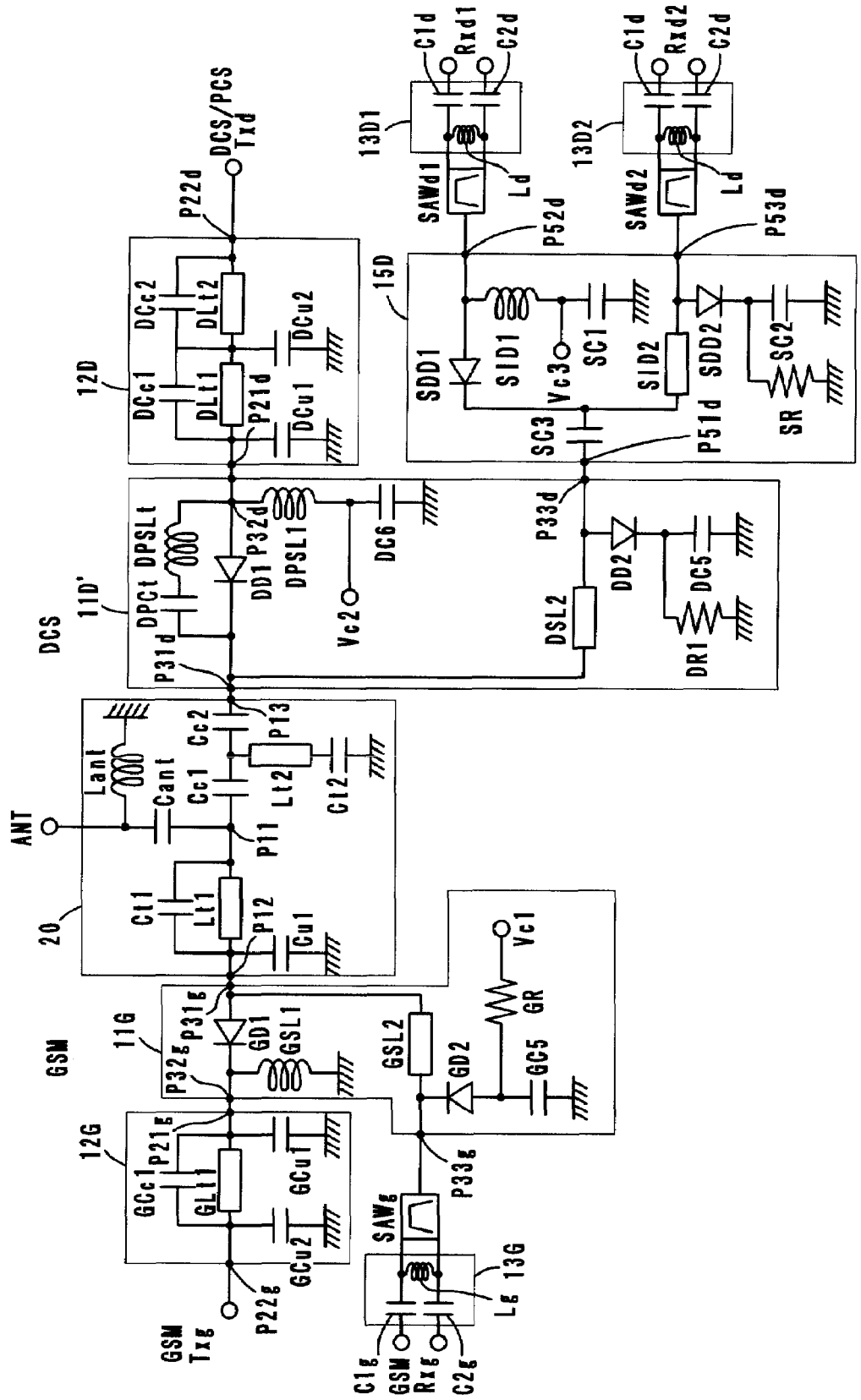
FIG. 16 is an equivalent circuit diagram of a fifth preferred embodiment of a high-frequency composite component according to the present invention.

Fifth Preferred Embodiment (FIG. 16)

A high-frequency composite component according to a fifth preferred embodiment is a triple-band type, as shown in an equivalent circuit of FIG. 16. The structure is basically the same as that of the fourth preferred embodiment (see FIG. 11) and the operation effect is also the same as the fourth preferred embodiment. The different between the fifth preferred embodiment and the fourth preferred embodiment is that the reception-side balanced output terminals Rxd1 and Rxd2 are separated by a diode switch 15D, instead of by the duplexer 14D.

The diode switch 15D includes diodes SDD1 and SDD2 as switching elements, inductors SID1 and SID2, capacitors SC1, SC2, and SC3, and a resistor SR. A first port P51d is connected to the third port P33d of the second high-frequency switch 11D', and the other end of the capacitor SC3, one end of which is connected to the first port P51d, is connected to the anode of the diode SDD2 through the cathode of the diode SDD1 and the inductor SID2.

The anode of the diode SDD1 is grounded through the inductor SID1 and the capacitor SC1, and a control terminal Vc3 is connected to the connection point between the inductor SID1 and the capacitor SC1. The cathode of the diode SDD2 is grounded through the capacitor SC2, and the connection point between the cathode and the capacitor SC2 is grounded through the resistor SR. The second port P52d connected to the anode of the diode SDD1 is connected to the second surface acoustic wave filter SAWd1. Furthermore, the third port P53d connected to the anode of the diode SDD2 is connected to the third surface acoustic wave filter SAWd2.

Figure 17:
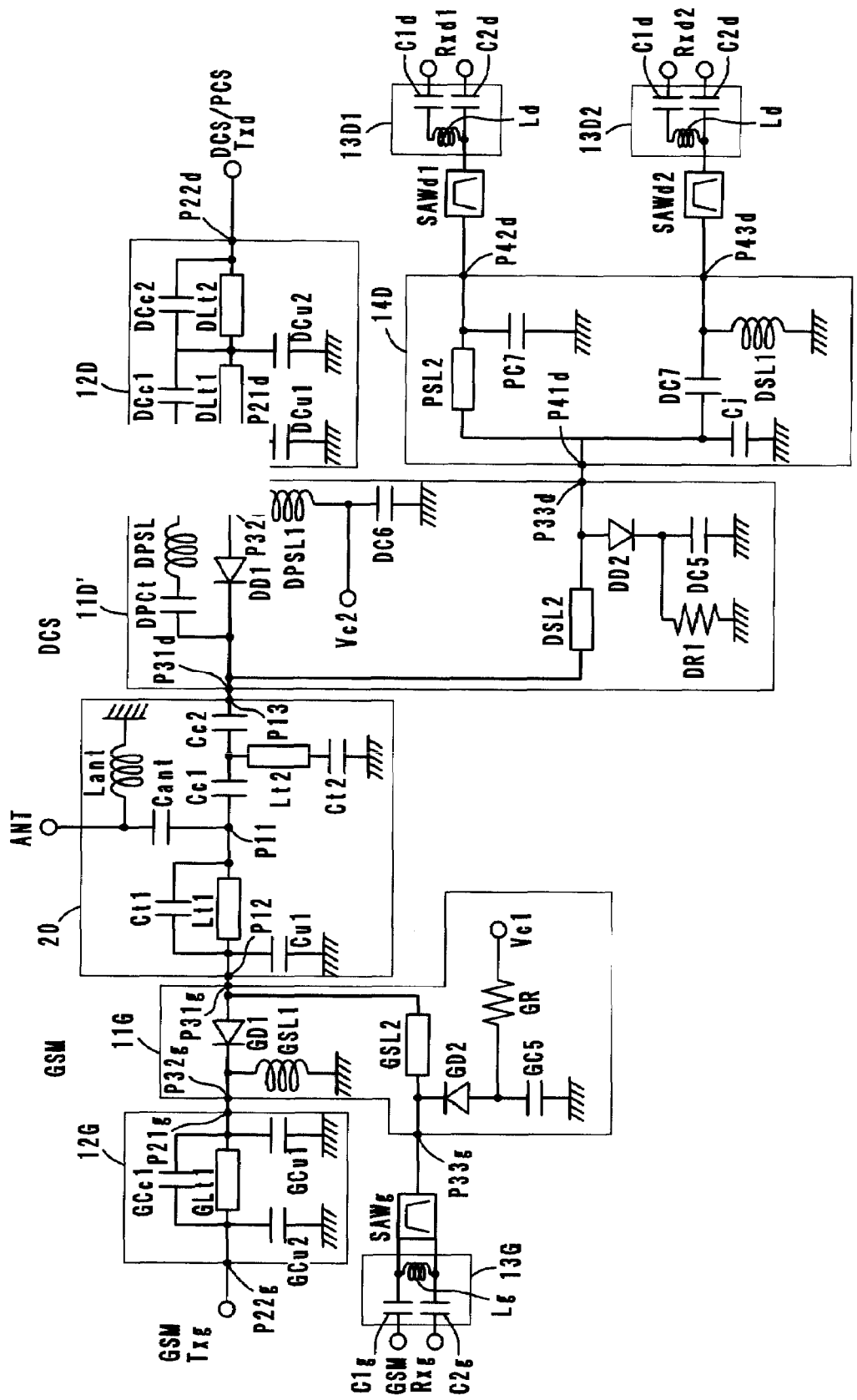
FIG. 17 is an equivalent circuit diagram of a sixth preferred embodiment of a high-frequency composite component according to the present invention.
Figure 18:
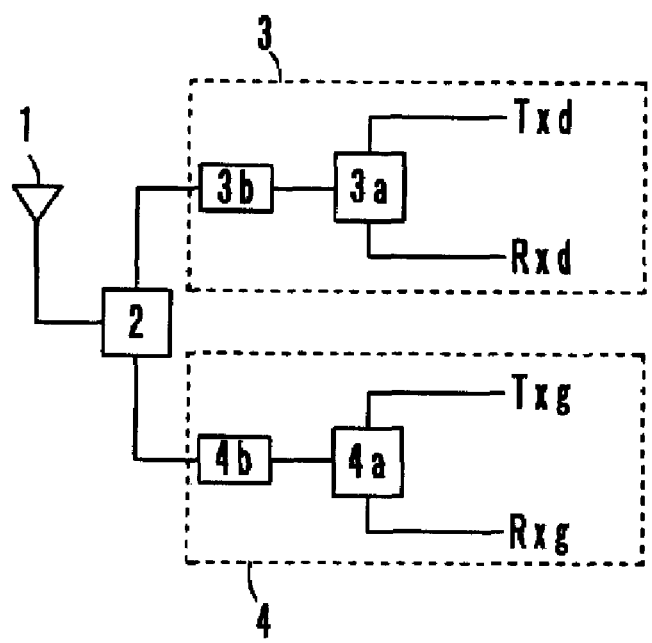
FIG. 18 is a block diagram showing a switching circuit of a related dual-band portable telephone.
Figure 19:
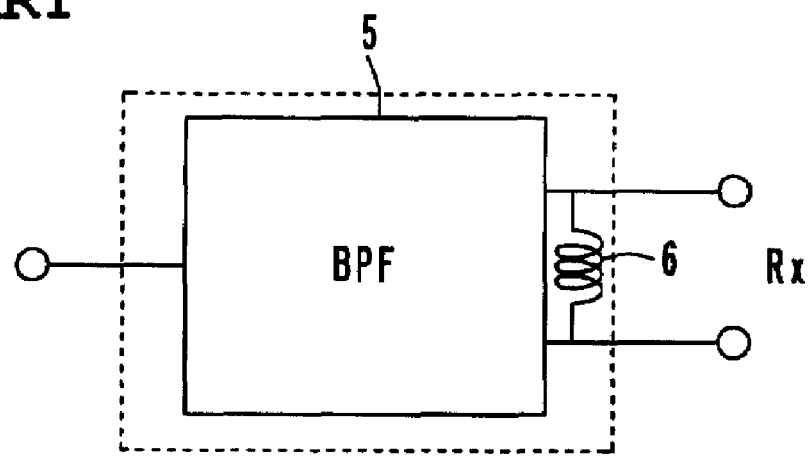
FIG. 19 is a block diagram showing the outline of the structure of a related bandpass filter.

Sixth Preferred Embodiment (FIG. 17)

A high-frequency composite component according to the sixth preferred embodiment is a triple-band type high-frequency composite component, as shown in FIG. 17. The structure is basically the same as that of the fourth preferred embodiment (see FIG. 11) and the operation effect is also the same as in the fourth preferred embodiment. The difference is that the surface acoustic wave filters SAWd1 and SAWd2 having unbalanced output ports are of an unbalanced type and the matching elements 13D1 and 13D2 connected to the unbalanced output ports are defined as baluns.

Other Embodiments

Moreover, the high-frequency composite components according to the present invention are not limited to the above-described embodiments, and various modifications can be made without departing from the spirit and the scope of the invention.

For example, in the above-described preferred embodiments, high-frequency composite components of a single-band type, a dual-band type, and a triple-band type were described, but the present invention can be also applied to high-frequency composite components of any multi-band type, such as a quad-band type.

Furthermore, in the above-described preferred embodiments, although the LC filters 12, 12G, and 12D for attenuating higher-order harmonics are disposed between the high-frequency switches are 11, 11G, 11D, and 11D' and the transmission-side input terminals Tx, Txg, and Tsd, they may be disposed between the antenna terminal ANT (diplexer 20) and the high-frequency switch.

As described above, the present invention is useful for a high-frequency composite component which can be utilized in a plurality of different mobile communication systems and, in particular, is advantageous because a desired impedance can be easily set and no matching adjustment to LNAs is required.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency composite component comprising:
a switch for selectively switching a signal path between an antenna terminal and a transmission-side input terminal and a signal path between the antenna and a reception-side balanced output terminal;
an LC filter including an inductor and capacitors disposed between the antenna terminal and the transmission-side input terminal;
a surface acoustic wave filter disposed between the switch and the reception-side balanced output terminal; and
a matching element including an inductor and capacitors disposed between the surface acoustic wave filter and the reception-side balanced output terminal; wherein
the switch, the LC filter, the surface acoustic wave filter, and the matching element are integrated in a laminated block including a plurality of laminated dielectric layers; and
the surface acoustic wave filter is a balanced-type surface acoustic wave filter having balanced output ports, the inductor of the matching element is connected in parallel between the balanced output ports, and the capacitors of the matching element are connected in series to the balanced output ports.

2. A high-frequency composite component according to claim 1, wherein the inductor of the matching element is disposed in a first area of the laminated block, and the inductor and the capacitors of the LC filter are disposed in a second area different from the first area as viewed from above the laminated block.

3. A high-frequency composite component according to claim 1, wherein the inductor of the matching element is mounted on the surface of the laminated block, and the inductor and the capacitors of the LC filter are disposed inside the laminated block.

4. A high-frequency composite component according to claim 1, wherein a ground electrode is disposed between the inductor of the matching element and the inductor and the capacitors of the LC filter.

5. A high-frequency composite component according to claim 1, wherein a shunt capacitor of the capacitors of the LC filter is disposed in the vicinity of the lowermost layer of the laminated block.

6. A high-frequency composite component according to claim 1, wherein the inductor and the capacitors of the matching element are provided on the surface of the laminated block, and the inductor of the matching element is disposed so as to be directly next to the capacitors of the matching element with no other element therebetween.

7. A high-frequency composite component according to claim 1, wherein the inductor of the matching element does not overlap with the inductor and the capacitors of the LC filter as viewed from above the laminated block.

8. A high-frequency composite component comprising:
a switch for selectively switching a signal path between an antenna terminal and a transmission-side input terminal and a signal path between the antenna and a reception-side balanced output terminal;
an LC filter disposed between the antenna terminal and the transmission-side input terminal;
a surface acoustic wave filter disposed between the switch and the reception-side balanced output terminal; and
a matching element disposed between the surface acoustic wave filter and the reception-side balanced output terminal; wherein
the switch, the LC filter, the surface acoustic wave filter, and the matching element are integrated in a laminated block including a plurality of laminated dielectric layers; and
the surface acoustic wave filter is a balanced-type surface acoustic wave filter having balanced output ports, the inductor of the matching element is connected in parallel between the balanced output ports, and the plurality of capacitors of the matching element are connected in series to the balanced output ports.

9. A high-frequency composite component according to claim 8, wherein the matching element includes an inductor and a plurality of capacitors, and the LC filter includes an inductor and a plurality of capacitors.

10. A high-frequency composite component according to claim 9, wherein the inductor of the matching element is disposed in a first area of the laminated block, and the inductor and the plurality of capacitors of the LC filter are disposed in a second area different from the first area as viewed from above the laminated block.

11. A high-frequency composite component according to claim 9, wherein the inductor of the matching element is mounted on the surface of the laminated block, and the inductor and the plurality of capacitors of the LC filter are disposed inside the laminated block.

12. A high-frequency composite component according to claim 9, wherein a ground electrode is disposed between the inductor of the matching element and the inductor and the plurality of capacitors of the LC filter.

13. A high-frequency composite component according to claim 9, wherein a shunt capacitor of the plurality of capacitors of the LC filter is disposed in the vicinity of the lowermost layer of the laminated block.

14. A high-frequency composite component according to claim 9, wherein the inductor and the plurality of capacitors of the matching element are provided on the surface of the laminated block, and the inductor of the matching element is disposed so as to be directly next to the plurality of capacitors of the matching element with no other element therebetween.

15. A high-frequency composite component according to claim 9, wherein the inductor of the matching element does not overlap with the inductor and the plurality of capacitors of the LC filter as viewed from above the laminated block.

* * * * *